(12) United States Patent
Chen et al.

(10) Patent No.: US 10,714,343 B1
(45) Date of Patent: Jul. 14, 2020

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventors: Zhuofan Chen, Shanghai (CN); Haiyang Zhang, Shanghai (CN)

(73) Assignees: Semiconductor Manufacturing (Shanghai) International Corporation, Shanghai (CN); Semiconductor Manufacturing (Beijing) International Corporation, Beijing (CN)

(*) Notice: Subject to any disclaimer, the term of this patent is extended or adjusted under 35 U.S.C. 154(b) by 0 days.

(21) Appl. No.: 16/601,814

(22) Filed: Oct. 15, 2019

(30) Foreign Application Priority Data

Feb. 2, 2019 (CN) .......................... 2019 1 0107844

(51) Int. Cl.
| | |
|---|---|
| *H01L 21/033* | (2006.01) |
| *H01L 21/3115* | (2006.01) |
| *H01L 21/02* | (2006.01) |
| *H01L 21/311* | (2006.01) |

(52) U.S. Cl.
CPC ...... *H01L 21/0337* (2013.01); *H01L 21/0217* (2013.01); *H01L 21/0228* (2013.01); *H01L 21/02164* (2013.01); *H01L 21/31105* (2013.01); *H01L 21/31111* (2013.01); *H01L 21/31116* (2013.01); *H01L 21/31155* (2013.01)

(58) Field of Classification Search
None
See application file for complete search history.

(56) References Cited

U.S. PATENT DOCUMENTS

| | | | |
|---|---|---|---|
| 2019/0164758 A1* | 5/2019 | Su .................. | H01L 21/3105 |
| 2019/0172714 A1* | 6/2019 | Bobek ............. | H01L 21/0234 |
| 2019/0287802 A1* | 9/2019 | Chang ............. | H01L 21/31144 |

* cited by examiner

*Primary Examiner* — Steven B Gauthier
(74) *Attorney, Agent, or Firm* — Brinks Gilson & Lione

(57) ABSTRACT

A semiconductor structure and a method for forming the same are provided. The method includes: providing a base; forming a to-be-etched material layer on the base; forming a mask material layer on the to-be-etched material layer; performing a first doping treatment on a partial region of the mask material layer, where after the first doping treatment is performed, the mask material layer includes a first mask-material-layer part and a to-be-removed second mask-material-layer part, and the first mask-material-layer part is a part that has undergone the first doping treatment or the second mask-material-layer part is a part that has undergone the first doping treatment; forming a first trench in the mask material layer, where the first trench is at least located in the first mask-material-layer part; removing the second mask-material-layer part, and forming a second trench in the remaining mask material layer; removing the to-be-etched material layer exposed from the first trench and the second trench, and forming a target pattern layer; and after the target pattern layer is formed, removing the remaining mask material layer. By using the present disclosure, the pattern precision of the first trench and the second trench is improved, and the pattern precision in the target pattern layer is correspondingly improved.

21 Claims, 9 Drawing Sheets

SEMICONDUCTOR STRUCTURE AND METHOD FOR FORMING SAME

RELATED APPLICATIONS

The present application claims priority to Chinese Patent Appln. No. 201910107844.9, filed Feb. 2, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

With the rapid growth of the semiconductor integrated circuit (IC) industry, process nodes in the semiconductor technology has become increasingly small according to Moore's law. Therefore, ICs have increasingly small volumes and become increasingly precise and complex.

In the development of ICs, generally, functional density (that is, the number of interconnected structures per chip) gradually increases while geometric size (that is, the size of the smallest component that can be created using process steps) gradually decreases. Correspondingly, IC manufacturing becomes more difficult and complex.

Currently, as technological nodes become increasingly small, it becomes challenging to enable a pattern formed on a wafer to better match a target pattern.

SUMMARY

One problem to be addressed by embodiments and implementations of the present disclosure is to provide a semiconductor structure and a method for forming same, to improve pattern precision.

To address the foregoing problem, one form of the present disclosure provides a method for forming a semiconductor structure, including: providing a base; forming a to-be-etched material layer on the base; forming a mask material layer on the to-be-etched material layer; performing a first doping treatment on a partial region of the mask material layer, where the first doping treatment is suitable for increasing an etching selection ratio of the mask material layer that has not undergone the first doping treatment to the mask material layer that has undergone the first doping treatment, and after the first doping treatment is performed, the mask material layer includes a first mask-material-layer part and a to-be-removed second mask-material-layer part, and the first mask-material-layer part is a part that has undergone the first doping treatment in the mask material layer, or, the second mask-material-layer part is a part that has undergone the first doping treatment in the mask material layer; after the first doping treatment is performed, forming, in the mask material layer, a first trench exposing a part of the to-be-etched material layer, where the first trench is at least located in the first mask-material-layer part; after the first trench is formed, removing the second mask-material-layer part, and forming a second trench exposing a part of the to-be-etched material layer in the remaining mask material layer; removing the to-be-etched material layer exposed from the first trench and the second trench, and forming a target pattern layer; and after the target pattern layer is formed, removing the remaining mask material layer.

Another form of the present disclosure further provides a semiconductor structure, including: a base; a to-be-etched material layer, located on the base; a mask material layer, located on the to-be-etched material layer, where the mask material layer includes a first mask-material-layer part and a to-be-removed second mask-material-layer part, the first mask-material-layer part has doping ions, or, the second mask-material-layer part has doping ions; and a trench, located in the mask material layer, where the trench is at least located in the first mask-material-layer part.

Compared with the prior art, technical solutions in embodiments and implementations of the present disclosure have the following advantages.

In embodiments and implementations of the present disclosure, using a first doping treatment, a mask material layer is divided into a first mask-material-layer part and a second mask-material-layer part, where an etching selection ratio of the first mask-material-layer part to the second mask-material-layer part is relatively large. After the first doping treatment is performed, a first trench is formed in the mask material layer, where the first trench is at least located in the first mask-material-layer part. After the first trench is formed, the second mask-material-layer part is removed, and a second trench is formed in the remaining mask material layer. Compared with a solution in which the first trench and the second trench are formed in a same step, in embodiments and implementations of the present disclosure, the first trench and the second trench are separately formed. In one aspect, the process window for forming the first trench and the second trench is increased (for example, optical proximity effects are mitigated), so that the pattern precision of the first trench and the second trench is ensured. In another aspect, an etching selection ratio of the second mask-material-layer part to the first mask-material-layer part is relatively large, so that the process window for forming the second trench is further increased (for example, the second mask-material-layer part may be removed by using maskless etching), thereby ensuring the pattern precision of the second trench. In conclusion, in embodiments and implementations of the present disclosure, the pattern precision of the first trench and the second trench is improved. Correspondingly, after a to-be-etched material layer exposed from the first trench and the second trench is removed to form a target pattern layer, the pattern precision in the target pattern layer is correspondingly improved.

BRIEF DESCRIPTION OF THE DRAWINGS

The accompanying drawings constitute a part of this specification, describe exemplary embodiments and implementations of the present disclosure, and are used to explain the principles of the present disclosure together with this specification. In the accompanying drawings.

DETAILED DESCRIPTION

Figure 1:
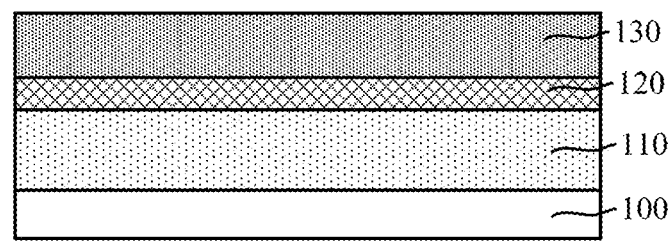
FIG. 1 to FIG. 24 are schematic structural diagrams corresponding to steps in one form of a method for forming a semiconductor structure.

Exemplary embodiments and implementations of the present disclosure are described in detail with reference to the accompanying drawings. It should be understood that unless otherwise specifically described, relative arrangements, numerical expressions, and values of parts and steps stated in these embodiments and implementations should not be understood as limitations to the scope of the present disclosure.

As can be seen from the related art, as technological nodes become increasingly small, it becomes challenging to enable a pattern formed on a wafer to better match a target pattern.

It is found through research that the pitch between photoresist patterns keeps decreasing as technological nodes become increasingly small. However, under the influence of a photolithography process, when the pitch between adjacent photolithographic patterns is less than a threshold distance of the photolithography process, the photoresist patterns tend to deform or distort. When the photoresist patterns are transferred to a film layer to be patterned to form a target pattern (for example, a trench), pattern precision of the target pattern is correspondingly reduced.

To address the technical problem, in implementations of the present disclosure, using a first doping treatment, a mask material layer is divided into a first mask-material-layer part and a second mask-material-layer part, where an etching selection ratio of the first mask-material-layer part to the second mask-material-layer part is relatively large. After the first doping treatment is performed, a first trench is formed in the mask material layer, where the first trench is at least located in the first mask-material-layer part. After the first trench is formed, the second mask-material-layer part is removed, and a second trench is formed in the remaining mask material layer. Compared with a solution in which the first trench and the second trench are formed in a same step, in the embodiments of the present disclosure, the first trench and the second trench are separately formed. In one aspect, the process window for forming the first trench and the second trench is increased, so that the pattern precision of the first trench and the second trench is ensured. In another aspect, an etching selection ratio of the second mask-material-layer part to the first mask-material-layer part is relatively large, so that the process window for forming the second trench is further increased, thereby ensuring the pattern precision of the second trench. In conclusion, in the embodiments of the present disclosure, the pattern precision of the first trench and the second trench is improved. Correspondingly, after a to-be-etched material layer exposed from the first trench and the second trench is removed to form a target pattern layer, the pattern precision in the target pattern layer is correspondingly improved.

To make the foregoing objectives, features, and advantages of the embodiments of the present disclosure more understandable, specific embodiments and implementations of the present disclosure are described below in detail with reference to the accompanying drawings.

FIG. 1 to FIG. 24 are schematic structural diagrams corresponding to steps in one form of a method for forming a semiconductor structure.

Referring to FIG. 1, a base 100 is provided.

The base 100 is used to provide a process platform for a subsequent process. In some implementations, for example, a formed semiconductor structure is a planar transistor. The base 100 includes a substrate.

Specifically, the substrate is a silicon substrate. In other implementations, the material of the substrate may further be germanium, silicon-germanium, silicon carbide, gallium arsenide, indium gallium phosphide, among other materials. The substrate may further be another type of substrate such as a silicon-on-insulator substrate or a germanium-on-insulator substrate.

In other implementations, when the formed semiconductor structure is a fin field-effect transistor, the base may correspondingly include a substrate and a fin protruding from the substrate.

The base 100 may further include another structure such as a gate structure, a doped region, a shallow trench isolation (STI) structure, and a dielectric layer. The gate structure may be a metal gate structure or a polysilicon gate structure.

In some implementations, the base 100 further includes an inter-layer dielectric layer (not shown) formed on the substrate and a contact (CT) hole plug (not shown) formed in the inter-layer dielectric layer.

Continue to refer to FIG. 1. The forming method further includes: forming a dielectric layer 110 on the base 100.

The dielectric layer 110 is used to electrically isolate subsequently formed interconnection structures.

In some implementations, the dielectric layer 110 is an inter metal dielectric (IMD) layer, and the dielectric layer 110 is used to electrically isolate metal interconnection structures in a back end of line (BEOL) process.

Specifically, the dielectric layer 110 is a first IMD used to electrically isolate first metal interconnection lines (that is, M1 layers). The first metal interconnection line is a metal interconnection structure closest to a contact hole plug.

In other implementations, the dielectric layer may further be another IMD located on the first metal interconnection line and used to electrically isolate other interconnection structures. For example, the dielectric layer is a second IMD used to electrically isolate second metal interconnection lines and electrically isolate via structures located between the second metal interconnection line and the first metal interconnection line.

Accordingly, the material of the dielectric layer 110 is a low k dielectric material (the low k dielectric material is a dielectric material having a relative dielectric constant greater than or equal to 2.6 and less than or equal to 3.9), an ultra-low k dielectric material (the ultra-low k dielectric material is a dielectric material having a relative dielectric constant less than 2.6), silicon oxide, silicon nitride, silicon oxynitride or the like.

In some implementations, the material of the dielectric layer 110 is an ultra-low k dielectric material, to reduce a parasitic capacitance between BEOL metal interconnection structures, thereby reducing a BEOL RC delay. Specifically, the ultra-low k dielectric material may be SiOCH.

Continue to refer to FIG. 1. A to-be-etched material layer 120 is formed on the base 100.

After a subsequent patterning process is performed on the to-be-etched material layer 120, a target pattern that penetrates the thickness of the to-be-etched material layer 120 is formed inside the to-be-etched material layer 120, so as to make process preparation for transfer of the target pattern.

In some implementations, the to-be-etched material layer 120 is formed on the dielectric layer 110. The to-be-etched material layer 120 is a hard mask (HM) material layer. That is, the material of the to-be-etched material layer is an HM material. After the to-be-etched material layer 120 is subsequently patterned to form a target pattern layer, the target pattern layer is used as a mask for patterning the dielectric layer 110.

Accordingly, the material of the to-be-etched material layer 120 may include one or more of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, and tungsten nitride.

In some implementations, the dielectric layer 110 is an IMD layer. Therefore, the to-be-etched material layer 120 is a metal HM (MHM) material layer. Specifically, the material of the to-be-etched material layer 120 is titanium nitride. The titanium nitride is a common MHM layer material in a BEOL process.

In other implementations, the to-be-etched material layer may further be a stacked structure, including a bottom etch stop material layer, an HM material layer located on the bottom etch stop material layer, and a top etch stop material layer located on the HM material layer. The materials of the bottom etch stop material layer and the top etch stop material layer are usually silicon oxide. The bottom etch stop material layer is used to make it less likely to overetch the dielectric layer in the process of patterning the HM material layer. The top etch stop material layer is used to protect the HM material layer. During patterning of a film layer located above the HM material layer, it becomes less likely to overetch the HM material layer. The top etch stop material layer and the bottom etch stop material layer are used to improve the process window and profile control in an etching process.

Continuing to refer to FIG. 1, a mask material layer 130 is formed on the to-be-etched material layer 120.

A subsequent process includes: patterning the mask material layer 130. The patterned mask material layer 130 is used as a mask for patterning the to-be-etched material layer 120.

Therefore, an etching selection ratio of the mask material layer 130 to the to-be-etched material layer 120 is relatively high, so that selective etching is implemented in a subsequent etching process. In some implementations, the material of the mask material layer 130 is different from the material of the to-be-etched material layer 120.

In some implementations, the mask material layer 130 is amorphous silicon (a-Si). The amorphous silicon is a common mask material used for patterning an MHM material layer in a BEOL process. In other implementations, the material of the mask material layer 130 is chosen according to the material of the to-be-etched material layer. The material of the mask material layer may further be silicon oxide or silicon nitride.

Figure 6:
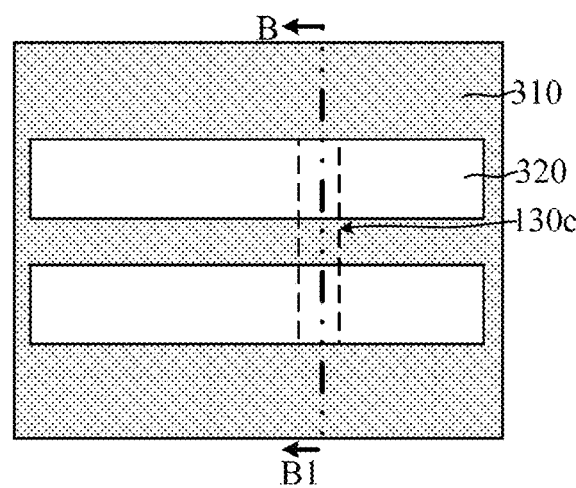
Figure 7:
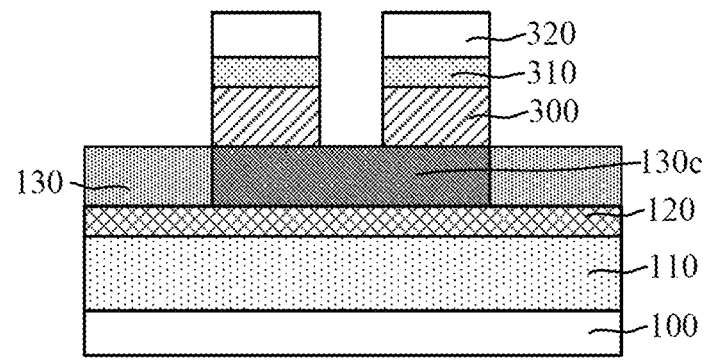
Figure 8:
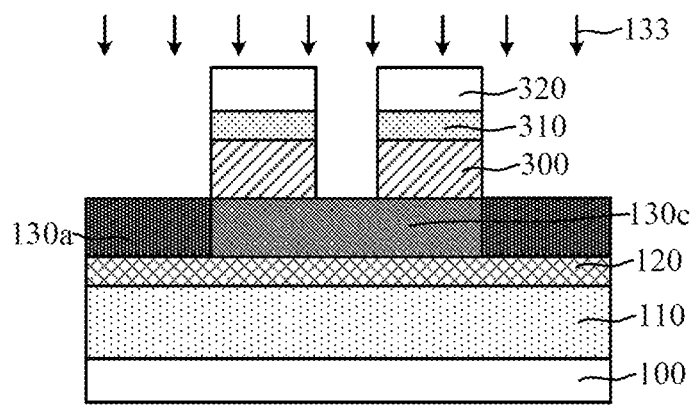

With reference to FIG. 2 to FIG. 9, a first doping treatment 133 (as shown in FIG. 8) is performed on a partial region of the mask material layer 130. The first doping treatment is suitable for increasing an etching selection ratio of the mask material layer 130 that has not undergone the first doping treatment 133 to the mask material layer 130 that has undergone the first doping treatment 133. After the first doping treatment 133 is performed, the mask material layer 130 includes a first mask-material-layer part 130a and a to-be-removed second mask-material-layer part 130b. The first mask-material-layer part 130a is a part that has undergone the first doping treatment 133 in the mask material layer 130.

A subsequent process further includes: forming, in the mask material layer 130, a first trench exposing a part of the to-be-etched material layer 120, where the first trench is at least located in the first mask-material-layer part 130a, after the first trench is formed, removing the second mask-material-layer part 130b, and forming, in the remaining mask material layer 130, a second trench exposing a part of the to-be-etched material layer 120. An etching selection ratio of the second mask-material-layer part 130b to the first mask-material-layer part 130a is relatively large, so that the process window for forming the second trench is significantly increased (for example, the second mask-material-layer part 130b may be removed by using maskless etching), and the pattern precision of the formed second trench is ensured.

The etching selection ratio of the mask material layer 130 that has not undergone the first doping treatment 133 to the mask material layer 130 that has undergone the first doping treatment 133 is a ratio of a removal rate of the second mask-material-layer part 130b to a removal rate of the first mask-material-layer part 130a.

In some implementations, the mask material layer 130 that has undergone the first doping treatment 133 is used as the first mask-material-layer part 130a, and the mask material layer 130 that has not undergone the first doping treatment 133 is used as the second mask-material-layer part 130b. By using the first doping treatment 133, impurity ions are doped in a partial region of the mask material layer 130, so that the material of the first mask-material-layer part 130a and the material of the second mask-material-layer part 130b have different microscopic structures. Specifically, by using the impurity ions, the grain boundary spacing in silicon in the material of the first mask-material-layer part 130a is reduced, thereby improving the thermal stability and chemical stability of the first mask-material-layer part 130a. When the stability is improved, the corrosion resistance capability of the first mask-material-layer part 130a is correspondingly improved, so that the etching selection ratio of the second mask-material-layer part 130b to the first mask-material-layer part 130a is increased. In this way, the first mask-material-layer part 130a is less affected by the subsequent process of removing the second mask-material-layer part 130b.

In some implementations, after the first doping treatment 133 is performed, the etching selection ratio of the second mask-material-layer part 130b to the first mask-material-layer part 130a is greater than or equal to 6, so that the first mask-material-layer part 130a is less likely to be etched and lost in the subsequent process of forming the second trench.

In some implementations, the material of the mask material layer 130 is amorphous silicon. Therefore, doping ions in the first doping treatment 133 are B ions. By doping B ions in a part of the amorphous silicon, the material of the first mask-material-layer part 130a turns into boron-doped silicon, so that the etching selection ratio of the second mask-material-layer part 130b to the first mask-material-layer part 130a is significantly increased. Moreover, B atoms are relatively stable, so that the thermal stability and chemical stability of the first mask-material-layer part 130a are improved. In addition, B ions are common doping ions in the semiconductor field and have relatively high process compatibility.

In some implementations, the first doping treatment is performed using an ion implantation process 133. An ion implantation process is relatively simple, and by adjusting implantation dosage, it is easy to adjust the etching selection ratio of the second mask-material-layer part 130b to the first mask-material-layer part 130a.

Specifically, the step of the first doping treatment 133 includes the following step.

FIG. 6 is a top view, and FIG. 7 is a sectional view along a section line BB1 in FIG. 6. A first pattern layer 320 is formed on the mask material layer 130 (as shown in FIG. 1).

The first pattern layer 320 blocks a partial region of the mask material layer 130 to prevent impurity ions in the subsequent first doping treatment from being doped in the region. In some implementations, the material of the first pattern layer 320 is a photoresist. The first pattern layer 320 is formed using a photolithography process.

It should be noted that before the first pattern layer 320 is formed, the method further includes: forming a first flattened layer 300 on the mask material layer 130; and forming a first anti-reflective coating 310 on the first flattened layer 300. The first pattern layer 320 is correspondingly formed on the first anti-reflective coating 310.

The first flattened layer 300 is used to provide a flat surface for forming the first pattern layer 320, thereby improving the pattern precision of the first pattern layer 320, so that the topography, size, and formation position of the first pattern layer 320 satisfy process requirements. In some implementations, the material of the first flattened layer 300 is a spin-on-carbon (SOC) material. In other implementations, the material of the first flattened layer may further be an organic dielectric layer (ODL) material or a deep ultraviolet light absorbing oxide (DUO) material.

The first anti-reflective coating 310 is used to mitigate a reflection effect during exposure, thereby improving the precision of pattern transfer. In some implementations, the first anti-reflective coating 310 is a Si-ARC layer. The Si-ARC layer helps to increase the exposure depth of field (DOF) during the photolithography process, thereby helping to improve exposure uniformity. Moreover, the Si-ARC layer is rich in silicon, and therefore further helps to increase the hardness of the first anti-reflective coating 310, thereby helping to further improving the precision of pattern transfer.

Accordingly, the forming method further includes: sequentially etching the first anti-reflective coating 310 and the first flattened layer 300 using the first pattern layer 320 as a mask, so as to expose the mask material layer 130 to be doped.

In other implementations, the first pattern layer may further be formed by using a self-aligned double patterning (SADP) process. The density of the pattern formed by using the SADP process may be twice that of the pattern formed using a photolithography process without changing a current photolithography technology (that is, the size of a photolithographic window is kept unchanged). To be specific, half of the minimum pitch can be obtained. In this way, as the critical dimension (CD) of a pattern keeps decreasing, the photolithography process exceeds the resolution limit of photolithography, so that the process of forming the first pattern layer becomes less difficult and the pattern precision of the first pattern layer is improved.

Referring to FIG. 8, by using an ion implantation process, the first doping treatment 133 is performed on the mask material layer 130 exposed from the first pattern layer 320 (as shown in FIG. 7).

After the first doping treatment 133 is performed, the mask material layer 130 exposed from the first pattern layer 320 is doped with impurity ions and used as the first mask-material-layer part 130a, and the mask material layer 130 that is not doped with impurity ions is used as the second mask-material-layer part 130b.

The implantation dosage for the first doping treatment 133 should neither be excessively low nor excessively high. When the implantation dosage is lower, the doping concentration of impurity ions in the first mask-material-layer part 130a is correspondingly lower, and the etching selection ratio of the second mask-material-layer part 130b to the first mask-material-layer part 130a can hardly satisfy process requirements. If the implantation dosage is excessively high, the doping concentration of impurity ions in the first mask-material-layer part 130a is correspondingly excessively high, and impurity ions in the first mask-material-layer part 130a diffuses easily into the first mask-material-layer part 130a to affect the etching selection ratio of the second mask-material-layer part 130b to the first mask-material-layer part 130a and correspondingly affect the topographic quality of the subsequent second trench. Accordingly, in some implementations, the implantation dosage for the first doping treatment 133 is 1E14 atoms per square centimeter to 1E16 atoms per square centimeter.

The implantation energy for the first doping treatment 133 should neither be excessively low nor excessively high. If the implantation energy is excessively low, it is difficult to ensure that the mask material layer 130 is doped with the impurity ions in the entire thickness range. During subsequent removal of the second mask-material-layer part 130b, the mask material layer 130 in the region corresponding to the first mask-material-layer part 130a is easily susceptible to loss. If the implantation energy is excessively large, the impurity ions are likely to be implanted into the to-be-etched material layer 120 below the mask material layer 130. As a result, the to-be-etched material layer 120 is adversely affected, and correspondingly subsequent processes cannot be normally performed. Accordingly, in some implementations, the implantation energy for the first doping treatment 133 is 1 Key to 10 Key.

An angle between the implantation direction of the first doping treatment 133 and the normal of the surface of the base 100 should not be excessively large. If the angle is excessively large, the impurity ions are likely to be doped accidentally into the first pattern layer 320 below the mask material layer 130. As a result, subsequently, the second mask-material-layer part 130b is removed less effectively. Accordingly, in some implementations, the angle between the implantation direction of the first doping treatment 133 and the normal of the surface of the base 100 is 0 degrees to 45 degrees. Specifically, when the doping ions in the first doping treatment 133 are B ions, the angle may be 0 degrees. To be specific, the implantation direction is perpendicular to the surface of the base 100.

Figure 9:
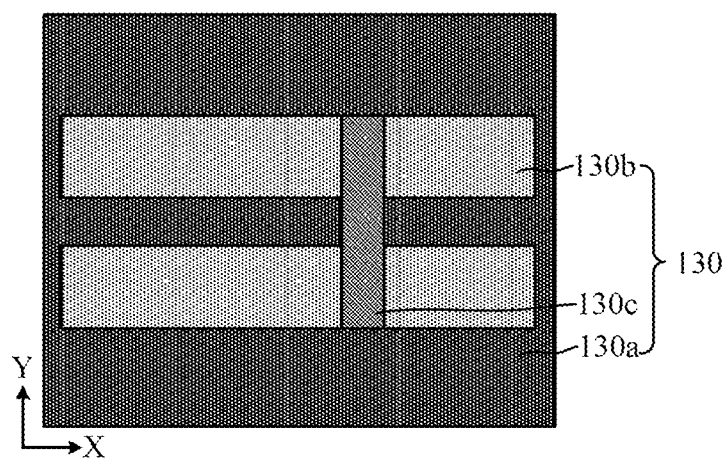

FIG. 9 is a top view. After the first doping treatment 133 is performed, the first pattern layer 320 (as shown in FIG. 8), the first anti-reflective coating 310 (as shown in FIG. 8), and the first flattened layer 300 (as shown in FIG. 8) are removed.

It should be noted that in other implementations, in the process of sequentially etching the first anti-reflective coating and the first flattened layer using the first pattern layer as a mask, the first pattern layer is susceptible to loss. After the mask material layer to be doped is exposed, the first pattern layer has been completely consumed. In this case, only the first anti-reflective coating and the first flattened layer need to be removed.

It should further be noted that in some implementations, after the first doping treatment 133 is performed, the second mask-material-layer part 130b has a bar-shaped cross section. An extension direction of the second mask-material-layer part 130b is the direction X, and a direction perpendicular to the extension direction of the second mask-material-layer part 130b is the direction Y.

Figure 2:
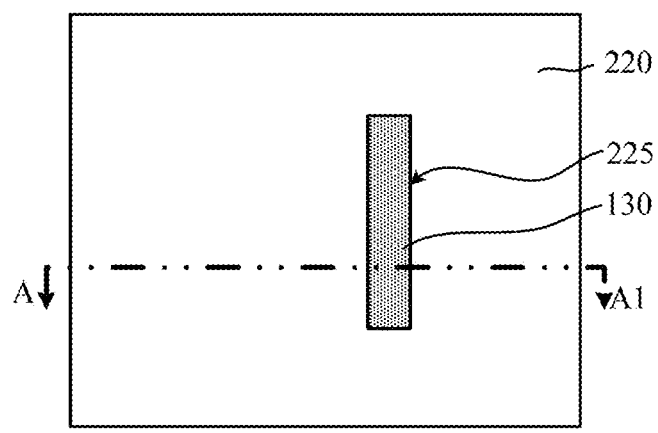
Figure 3:
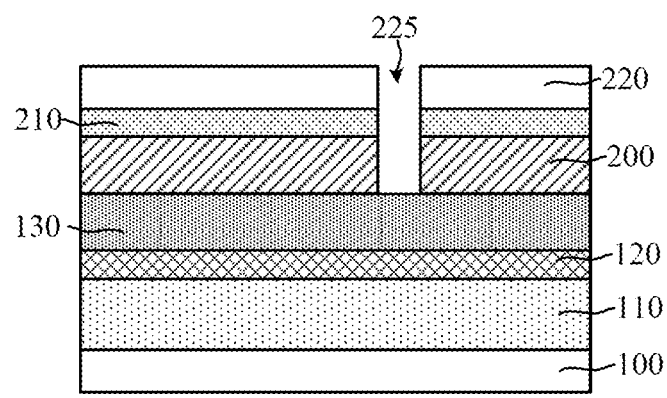
Figure 4:
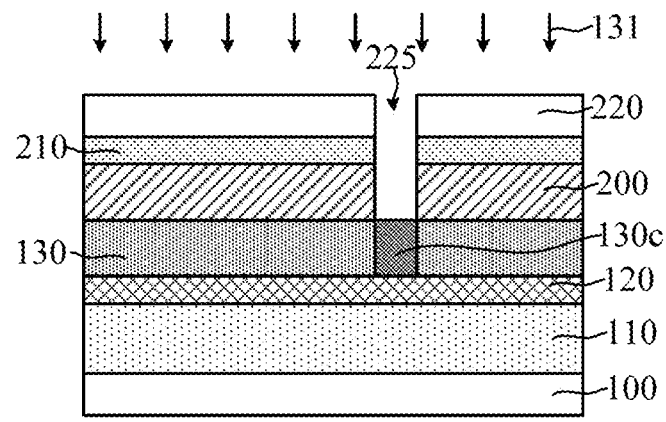
Figure 5:
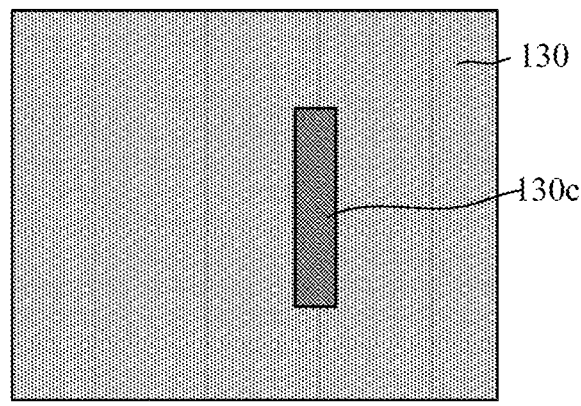

With reference to FIG. 2 to FIG. 5, the method further includes: before the first doping treatment 133 (as shown in FIG. 8), performing a second doping treatment 131 (as shown in FIG. 4) on a partial region of the mask material layer 130 (as shown in FIG. 3), where the first doping treatment is suitable for increasing an etching selection ratio of the mask material layer 130 that has not undergone the second doping treatment 131 to the mask material layer 130 that has undergone the second doping treatment 131, where the mask material layer 130 that has undergone the second doping treatment 131 is used as a third mask-material-layer part 130c (as shown in FIG. 5).

The third mask-material-layer part 130c is used as a cut feature for the subsequently formed second trench. After the first doping treatment 133 is subsequently completed, the third mask-material-layer part 130c is used to divide the second mask-material-layer part 130b (as shown in FIG. 9), so that after the second mask-material-layer part 130b is removed subsequently, a plurality of isolated second trenches are formed in the remaining mask material layer 130.

An etching selection ratio of the third mask-material-layer part 130c to the remaining mask material layer 130 that is not doped with ions is relatively large. Therefore, when the second mask-material-layer part 130b is subsequently removed, the third mask-material-layer part 130c can be kept, so that the process window for forming the second trench is correspondingly increased, and the pattern precision of the formed second trench is ensured. The etching selection ratio of the mask material layer 130 that has not undergone the second doping treatment 131 to the mask material layer 130 that has undergone the second doping treatment 131 is a ratio of a removal rate of the mask material layer 130 that has not undergone the second doping treatment 131 to a removal rate of the third mask-material-layer part 130c.

In some implementations, after the second doping treatment 131 is performed, the etching selection ratio of the third mask-material-layer part 130c to the remaining mask material layer 130 that is not doped with impurity ions is greater than or equal to 6, so that the third mask-material-layer part 130c is less likely to be etched and lost in the subsequent process of forming the second trench.

A subsequent process further includes: removing the first mask-material-layer part 130a (as shown in FIG. 9) and the third mask-material-layer part 130c. Therefore, during actual manufacturing, parameters of the first doping treatment 133 and the second doping treatment 131 are appropriately set, so that while it is ensured that the etching selection ratio satisfies process requirements, in the subsequent step of removing the remaining mask material layer 130, an etching selection ratio of the first mask-material-layer part 130a to the third mask-material-layer part 130c may be approximately 1 (for example, 0.8 to 1.2) to facilitate the removal of the first mask-material-layer part 130a and the third mask-material-layer part 130c in a same step, so as to simplify process steps.

In some implementations, doping ions in the second doping treatment 131 are the same as the doping ions in the first doping treatment 133, so that the subsequent step of removing the remaining mask material layer 130, it is easy to reduce a difference between removal rates of the first mask-material-layer part 130a and the third mask-material-layer part 130c to facilitate the removal of the first mask-material-layer part 130a and the third mask-material-layer part 130c in a same step.

In some implementations, the doping ions in the second doping treatment 131 are B ions.

In some implementations, the second doping treatment is performed by using an ion implantation process 131. An ion implantation process is relatively simple, and the etching selection ratio of the third mask-material-layer part 130c to the remaining mask material layer 130 that is not doped with impurity ions may be adjusted by adjusting the implantation dosage.

Specifically, the step of the second doping treatment 131 includes the following step.

FIG. 2 is a top view, and FIG. 3 is a sectional view along a section line AA1 in FIG. 2. A second pattern layer 220 is formed on the mask material layer 130 (as shown in FIG. 3).

A first pattern opening 225 (as shown in FIG. 3) is formed in the second pattern layer 220. The first pattern opening 225 exposes a partial region of the mask material layer 130 and is used to define a region for subsequently doping impurity ions into the mask material layer 130. In some implementations, the material of the second pattern layer 220 is a photoresist.

Therefore, as shown in FIG. 3, before the second pattern layer 220 is formed, the method further includes: forming a second flattened layer 200 on the mask material layer 130; and forming a second anti-reflective coating 210 on the second flattened layer 200. The second pattern layer 220 is correspondingly formed on the second anti-reflective coating 210.

In some implementations, the material of the second flattened layer 200 is SOC, and the second anti-reflective coating 210 is a Si-ARC layer. Refer to the foregoing detailed description of the first flattened layer 300 (as shown in FIG. 8) and the first anti-reflective coating 310 (as shown in FIG. 8) respectively for the detailed description of the second flattened layer 200 and the second anti-reflective coating 210, and details are not described herein again.

Accordingly, the forming method further includes: sequentially etching the second anti-reflective coating 210 and the second flattened layer 200 by using the second pattern layer 220 as a mask, so as to expose the mask material layer 130 to be doped.

Referring to FIG. 4, the second doping treatment 131 is performed on the mask material layer 130 exposed from the first pattern opening 225 by using an ion implantation process.

After the second doping treatment 131, the mask material layer 130 exposed from the first pattern opening 225 is used as the third mask-material-layer part 130c.

In some implementations, both an etching selection ratio of the third mask-material-layer part 130c to the subsequent second mask-material-layer part 130b and the etching selection ratio of the subsequent first mask-material-layer part 130a to the third mask-material-layer part 130c are considered and impurity ions are prevented from diffusing into a region in which doping is not intended, the implantation dosage of the second doping treatment 131 is 1E14 atoms per square centimeter to 1E16 atoms per square centimeter. Refer to the foregoing corresponding description of the second doping treatment 131 for the analysis of the implantation dosage, as details are not described herein again.

In some implementations, to ensure that the mask material layer 130 is doped with the impurity ions within the entire thickness in a region to be doped and the impurity ions are less likely to be implanted into the to-be-etched material layer 120, the implantation energy of the second doping treatment 131 is 1 Key to 10 Key. Refer to the foregoing corresponding description of the second doping treatment 133 for the analysis of the implantation energy, and details are not described herein again.

The first pattern opening 225 usually has a relatively small opening size. If the angle is excessively large, the shadow effect is severe to reduce a doping effect. Accordingly, in some implementations, the angle between the implantation direction of the second doping treatment 131 and the normal of the surface of the base 100 is 0 degrees to 45 degrees. Specifically, the angle may be 0 degrees. To be specific, the implantation direction is perpendicular to the surface of the base 100. Refer to the foregoing corresponding description of the second doping treatment 133 for the analysis of the angle, and details are not described herein again.

Refer to the foregoing corresponding description of the first doping treatment 133 (as shown in FIG. 8) for the detailed description of the second doping treatment 131, as details are not described herein again.

FIG. 5 is a top view. After the second doping treatment 131 (as shown in FIG. 4) is performed, the second pattern layer 220 (as shown in FIG. 4), the second anti-reflective coating 210 (as shown in FIG. 4), and the second flattened layer 200 (as shown in FIG. 4) are removed.

Accordingly, continue to refer to FIG. 9. In some implementations, after the first doping treatment 133 is performed, the first mask-material-layer part 130a is connected to the third mask-material-layer part 130c, and the mask material layer 130 corresponding to a region defined by the first mask-material-layer part 130a and the third mask-material-layer part 130c is the second mask-material-layer part 130b, that is, the third mask-material-layer part 130c penetrates the second mask-material-layer part 130b.

Accordingly, a plurality of isolated second mask-material-layer parts 130b are obtained by performing the first doping treatment 133 and the second doping treatment 131, so as to provide a process basis for subsequently forming a plurality of isolated second trenches.

Correspondingly, continue to refer to FIG. 6. In the step of forming the first pattern layer 320, the first pattern layer 320 traverses the third mask-material-layer part 130c, where in an extension direction of the third mask-material-layer part 130c, and a side wall of the first pattern layer 320 near a side of a border of the third mask-material-layer part 130c is level with the border of the third mask-material-layer part 130c.

Because impurity ions have been doped in the third mask-material-layer part 130c, in the extension direction of the first pattern layer 320, the first pattern layer 320 does not need to expose the mask material layer 130 in the region corresponding to the third mask-material-layer part 130c, so that the process of forming the first pattern layer 320 correspondingly becomes less difficult and the process window for forming the first pattern layer 320 is increased, thereby improving the pattern precision of the first pattern layer 320.

In some implementations, in the extension direction of the third mask-material-layer part 130c, the side wall of the first pattern layer 320 near a side of the border of the third mask-material-layer part 130c is level with the border of the third mask-material-layer part 130c, so that it is ensured that the third mask-material-layer part 130c can be connected to the first mask-material-layer part 130a, thereby isolating the third mask-material-layer part 130c from the second mask-material-layer part 130b.

The first pattern layer 320 exposes a part of the third mask-material-layer part 130c. However, because the first doping treatment 133 is used to increase the etching selection ratio of the mask material layer 130 that has not undergone the first doping treatment 133 to the mask material layer 130 that has undergone the first doping treatment 133, even if a part of the third mask-material-layer part 130c is doped with impurity ions through the first doping treatment 133, in the subsequent step of removing the second mask-material-layer part 130b, the third mask-material-layer part 130c can still be kept.

In other implementations, the first pattern layer may also expose the border of the third mask-material-layer part. That is, the third mask-material-layer part and the first mask-material-layer part have an overlapping portion. In this case, the third mask-material-layer part can still be isolated from the second mask-material-layer part, and in the subsequent step of removing the second mask-material-layer part 130b, the third mask-material-layer part 130c can still be kept.

It should be noted that in other implementations, the first doping treatment may alternatively be performed before the second doping treatment is performed.

Figure 10:
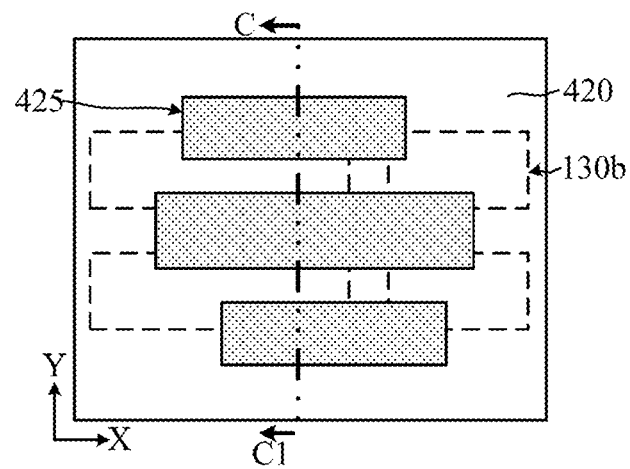
Figure 11:
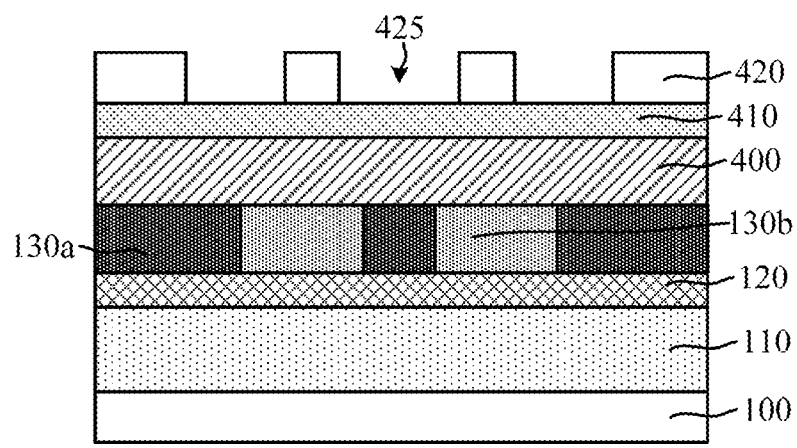
Figure 12:
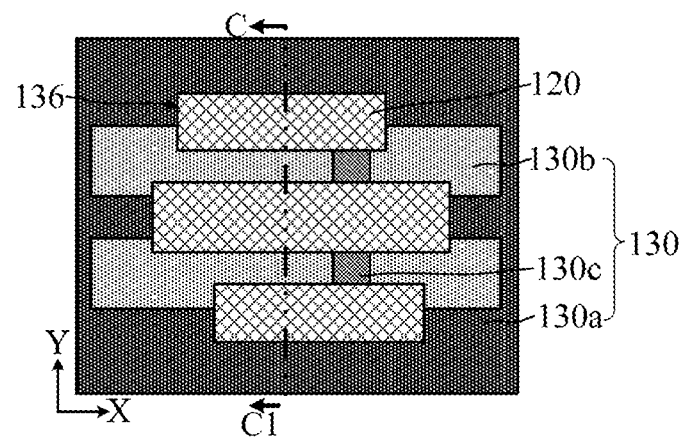

With reference to FIG. 10 to FIG. 13, after the first doping treatment 133 (as shown in FIG. 8) is performed, a first trench 136 (as shown in FIG. 12) exposing a part of the to-be-etched material layer 120 is formed in the mask material layer 130 (as shown in FIG. 12), and the first trench 136 is at least located in the first mask-material-layer part 130a.

The first trench 136 is used to define a partial region to be removed in the to-be-etched material layer 120.

In a subsequent process, the second mask-material-layer part 130b is further removed, and the second trench exposing a part of the to-be-etched material layer 120 is formed in the remaining mask material layer 130. Compared with a solution in which the first trench and the second trench are formed in a same step, in some implementations, the first trench 136 and the second trench are separately formed, so that the process window for forming the first trench 136 and the second trench is increased (for example, optical proximity effects are mitigated), and the pattern precision of the first trench 136 and the second trench is ensured.

The mask material layer 130 has not been patterned before the first trench 136 is formed, so that a flat surface is provided for forming the first trench 136, and correspondingly the process of forming the first trench 136 becomes less complex.

Specifically, the step of forming the first trench 136 includes the following step.

FIG. 10 is a top view, and FIG. 11 is a sectional view along a section line CC1 in FIG. 10. A third pattern layer 420 is formed on the mask material layer 130.

A second pattern opening 425 is formed in the third pattern layer 420, the second pattern opening 425 exposes a partial region of the mask material layer 130, and the second pattern opening 425 is used to define a formation region for the subsequent first trench. In some implementations, the material of the third pattern layer 420 is a photoresist.

Therefore, as shown in FIG. 11, before the third pattern layer 420 is formed, the method further includes: forming a third flattened layer 400 on the mask material layer 130; and forming a third anti-reflective coating 410 on the third flattened layer 400. The third pattern layer 420 is correspondingly formed on the third anti-reflective coating 410.

In some implementations, the material of the third flattened layer 400 is SOC, and the third anti-reflective coating 410 is a Si-ARC layer. Refer to the foregoing detailed description of the first flattened layer 300 (as shown in FIG. 7) and the first anti-reflective coating 310 (as shown in FIG. 7) respectively for the detailed description of the third flattened layer 400 and the third anti-reflective coating 410, and details are not described herein again.

Correspondingly, the forming method further includes: sequentially etching the third anti-reflective coating 410 and the third flattened layer 400 using the third pattern layer 420 as a mask, so as to expose the mask material layer 130 to be etched.

The mask material layer 130 has a flat surface. Therefore, the processes of forming and patterning the third pattern layer 420, the third anti-reflective coating 410, and the third flattened layer 400 become less complex.

In some implementations, the second pattern opening 425 traverses the third mask-material-layer part 130c. A same second pattern opening 425 not only exposes the first mask-material-layer part 130a on a side of the second mask-material-layer part 130b but also exposes a part of the third mask-material-layer part 130c and a part of the second mask-material-layer part 130b located on two sides of the third mask-material-layer part 130c, thereby reducing the subsequent pitch between the adjacent first trench and second trench and satisfying a complexity requirement of an IC design.

In other implementations, according to requirements of an IC design, a same second pattern opening may only expose the first mask-material-layer part on a side of the second mask-material-layer part. Alternatively, when the third mask-material-layer part and the first mask-material-layer part have an overlapping portion, the same second pattern opening may also only expose the first mask-material-layer part and the third mask-material-layer part on a side of the second mask-material-layer part.

Figure 13:
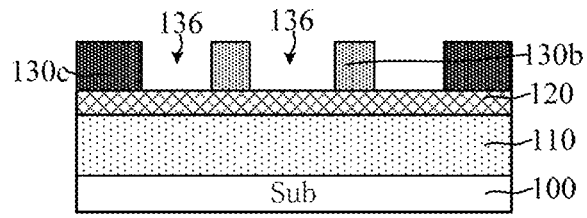

FIG. 12 is a top view, and FIG. 13 is a sectional view along a section line CC1 in FIG. 12. The mask material layer 130 exposed from the second pattern opening 425 (as shown in FIG. 11) is etched, and the first trench 136 is formed in the mask material layer 130.

In some implementations, the mask material layer 130 exposed from the second pattern opening 425 is etched using a dry etching process. The dry etching process has an anisotropic etching characteristic, so that the topographic quality of the first trench 136 is improved. Moreover, the dry etching process is chosen, so that it is easy to control an etch stop position, so as to reduce damage inflicted to the to-be-etched material layer 120. In addition, parameters of the dry etching process are adjusted appropriately, so that it is easy to etch the first mask-material-layer part 130a, the second mask-material-layer part 130b, and the third mask-material-layer part 130c in a same etching step.

In some implementations, after the first trench 136 is formed, an extension direction of the first trench 136 is the same as the extension direction (the direction X shown in FIG. 12) of the second mask-material-layer part 130b, and in a direction (the direction Y shown in FIG. 12) perpendicular to the extension direction of the second mask-material-layer part 130b, the first trench 136 is located at a boundary between the first mask-material-layer part 130a and the second mask-material-layer part 130b.

Specifically, the first trench 136 further penetrates the third mask-material-layer part 130c.

In some implementations, after the first trench 136 is formed, the third pattern layer 420 (as shown in FIG. 11), the third anti-reflective coating 410 (as shown in FIG. 11), and the third flattened layer 400 (as shown in FIG. 11) are removed.

Figure 14:
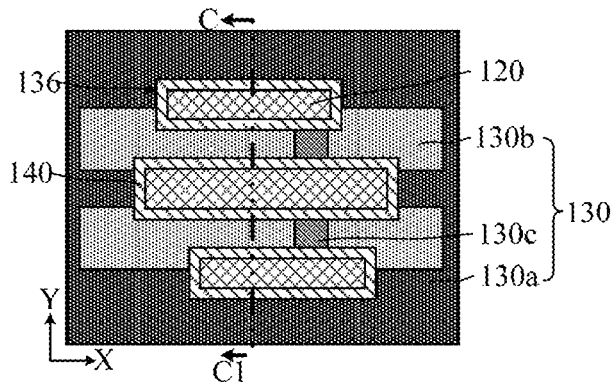
Figure 15:
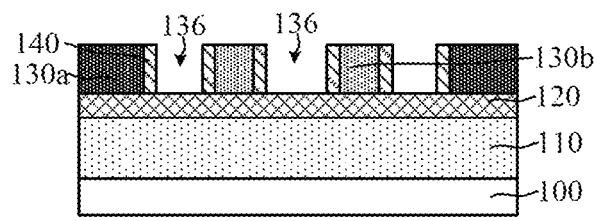

FIG. 14 is a top view, and FIG. 15 is a sectional view along a section line CC1 in FIG. 14. The forming method further includes: forming a side wall layer 140 on a side wall of the first trench 136.

Subsequently, after the remaining second mask-material-layer part 130b is removed, the second trench is formed in the remaining mask material layer 130. The side wall layer 140 is used to isolate the second trench from the first trench 136, thereby preventing communication between the second trench and the first trench 136. Moreover, the pitch between the adjacent second trench and first trench 136 has the designed minimum space.

Accordingly, an etching selection ratio of the side wall layer 140 to the second mask-material-layer part 130b is relatively high, so that the side wall layer 140 can be used as a mask for subsequently removing the remaining second mask-material-layer part 130b. In some implementations, the material of the side wall layer 140 is different from the material of the second mask-material-layer part 130b. The material of the side wall layer 140 is titanium oxide. Etching selection ratios of titanium oxide to amorphous silicon and titanium nitride are relatively high. In other implementations, the material of the side wall layer 140 is set according to the materials of the to-be-etched material layer and the mask material layer. The material of the side wall layer may further be titanium nitride, silicon oxide, silicon nitride, silicon oxynitride or silicon carbide.

Specifically, the step of forming the side wall layer 140 includes: forming a side wall material layer, where the side wall material layer conformally covers the side wall and the bottom of the first trench 136 and further covers the top of the mask material layer 130; and removing the side wall material layer at the bottom of the first trench 136 and the top of the mask material layer 130, and keeping the side wall material layer on the side wall of the first trench 136 as the side wall layer 140.

Conformal coverage is chosen to form the side wall material layer, so that the side wall material layer can be etched using maskless etching, so that the process complexity and costs are reduced. In some implementations, an atomic layer deposition process is chosen to form the side wall material layer. The atomic layer deposition process has desirable step coverage capability and can form a film layer material having relatively high thickness uniformity, so that the formation quality and thickness uniformity of the side wall layer 140 are improved.

In other implementations, when the first trench is only formed in the first mask-material-layer part on a side of the second mask-material-layer part or is only formed in the first mask-material-layer part and the third mask-material-layer part on a side of the second mask-material-layer part, the side wall layer may be omitted.

Figure 19:
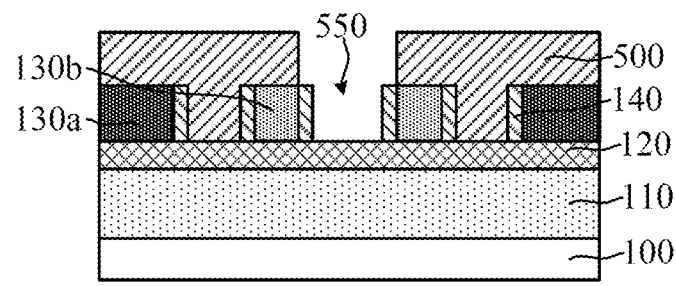
Figure 20:
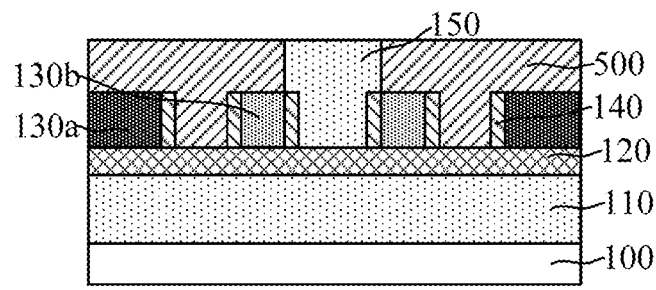
Figure 21:
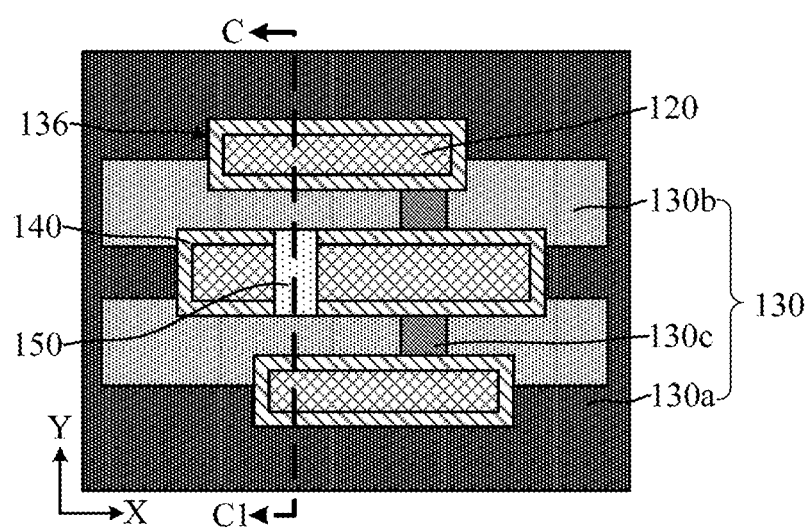

With reference to FIG. 16 to FIG. 21, after the side wall layer 140 is formed, the method further includes: at least forming a passivation layer 150 (as shown in FIG. 21) in one first trench 136 (as shown in FIG. 21), and in the extension direction (the direction X shown in FIG. 21) of the first trench 136, the corresponding remaining to-be-etched material layer 120 at the bottom of the first trench 136 is exposed from two sides of the passivation layer 150.

The passivation layer 150 is used as a cut feature for the first trench 136. In the extension direction of the first trench 136, the passivation layer 150 covers a partial region of the to-be-etched material layer 120, so that the to-be-etched material layer 120 below the passivation layer 150 is kept in a subsequent etching process. Correspondingly, when the pattern of the first trench 136 is transferred to the to-be-etched material layer 120, isolated patterns can be formed on the to-be-etched material layer 120. Compared with a solution in which the first trench 136 is divided in the extension direction of the first trench 136 using a photolithography process, in some implementations, the process window for forming the first trench 136 is increased, so that the precision of pattern transfer is improved.

Specifically, the step of forming the passivation layer 150 includes the following step.

Figure 16:
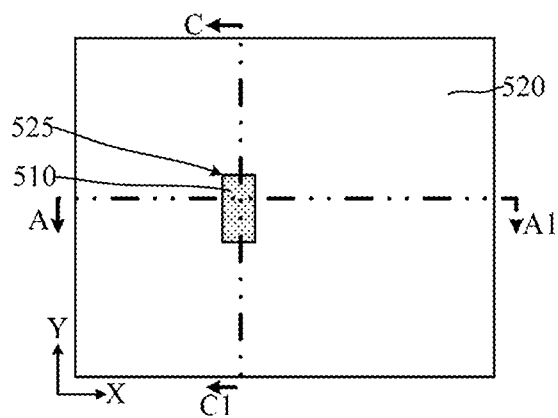
Figure 17:
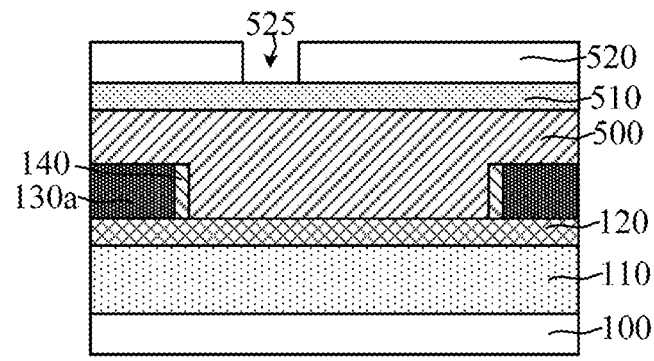
Figure 18:
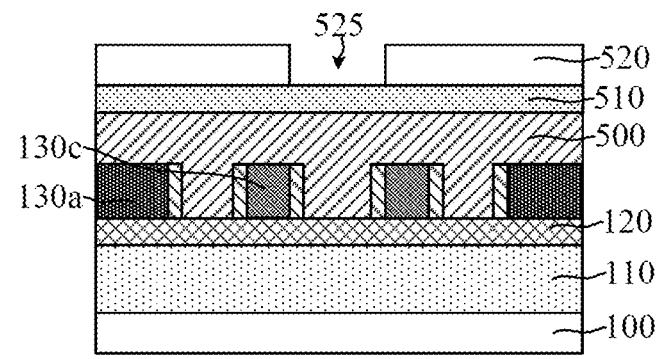

FIG. 16 is a top view, FIG. 17 is a sectional view along a section line AA1 in FIG. 16, and FIG. 18 is a sectional view along a section line CC1 in FIG. 16. A sacrifice layer 500 is formed on the to-be-etched material layer 120 exposed from the remaining mask material layer 130, and the sacrifice layer 500 further covers the top of the remaining mask material layer 130.

The sacrifice layer 500 is used to provide a process platform for subsequently forming the passivation layer.

After the passivation layer is formed subsequently, the sacrifice layer 500 further needs to be removed. Therefore, the material of the sacrifice layer 500 is an easily removable material. In some implementations, the sacrifice layer 500 is a SOC material.

The process of patterning the sacrifice layer 500 usually includes formation of a photoresist layer. A SOC material is chosen, so that the pattern precision of the photoresist layer is further improved, thereby improving the pattern precision of a through groove subsequently formed in the sacrifice layer 500. Refer to the foregoing detailed description of the first flattened layer 300 (as shown in FIG. 7) for the detailed description of the sacrifice layer 500, and details are not described herein again.

In other implementations, the material of the sacrifice layer may further be an ODL material or a bottom anti-reflective coating (BARC) material.

Continue to refer to FIG. 16 to FIG. 18, and refer to FIG. 19 together. FIG. 19 is a sectional view based on FIG. 18. A through groove 550 (as shown in FIG. 19) is formed in the sacrifice layer 500 above a partial region of the first trench 136 (as shown in FIG. 14), and in a direction (the direction Y shown in FIG. 16) perpendicular to the extension direction of the first trench 136, the through groove 550 at least exposes the corresponding to-be-etched material layer 120 at the bottom of the first trench 136.

Specifically, a fourth anti-reflective coating 510 is formed on the sacrifice layer 500. A fourth pattern layer 520 is formed on the fourth anti-reflective coating 510, where a third pattern opening 525 is formed in the fourth pattern layer 520 and is used to define a region to be etched in the sacrifice layer 500. The fourth anti-reflective coating 510 and the sacrifice layer 500 are sequentially etched along the third pattern opening 525, and the through groove 550 is formed in the sacrifice layer 500.

In some implementations, the fourth anti-reflective coating 510 is a Si-ARC layer, and the material of the fourth pattern layer 520 is a photoresist.

In some implementations, after the through groove 550 is formed, in a direction perpendicular to the extension direction of the first trench 136, the through groove 550 further exposes the side wall layer 140, so that an opening size of the third pattern opening 525 is correspondingly increased, and the process window for forming the third pattern opening 525 is increased. For example, the resolution limit of a photolithography process is exceeded. In other implementations, the through groove may alternatively only expose the to-be-etched material layer between side wall layers.

As shown in FIG. 19, in some implementations, after the through groove 550 is formed, the fourth pattern layer 520 (as shown in FIG. 18) and the fourth anti-reflective coating 510 (as shown in FIG. 18) are removed.

It should be noted that in other implementations, after the fourth anti-reflective coating and the sacrifice layer are sequentially etched along the third pattern opening, the fourth pattern layer and the fourth anti-reflective coating may also be completely consumed. Correspondingly, an additional step does not need to be used to remove the fourth pattern layer and the fourth anti-reflective coating.

FIG. 20 is a sectional view based on FIG. 19. The passivation layer 150 that fills the through groove 550 is formed.

Specifically, a passivation material layer is filled in the through groove 550. The passivation material layer further covers the top of the sacrifice layer 500. An etchback manner is used to remove the passivation material layer higher than the top of the sacrifice layer 500 to keep the passivation material layer in the through groove 550 as the passivation layer 150.

In some implementations, the material of the passivation layer 150 is low temperature oxide (LTO). The material has relatively high filling performance, so that the filling quality of the passivation layer 150 in the through groove 550 is improved. Moreover, the material is an easily removable material, so that the subsequent process of removing the passivation layer 150 becomes less difficult. Specifically, a low-pressure chemical vapor deposition (LPCVD) process is chosen to form the passivation layer 150.

In other implementations, the material of the passivation layer may further be SiOC. In other implementations, the material of the passivation layer may further be silicon oxide formed by using a flowable chemical vapor deposition (FCVD) process or another suitable material that may be formed by using an ALD process.

FIG. 21 is a top view. After the passivation layer 150 is formed, the sacrifice layer 500 (as shown in FIG. 20) is removed.

Figure 22:
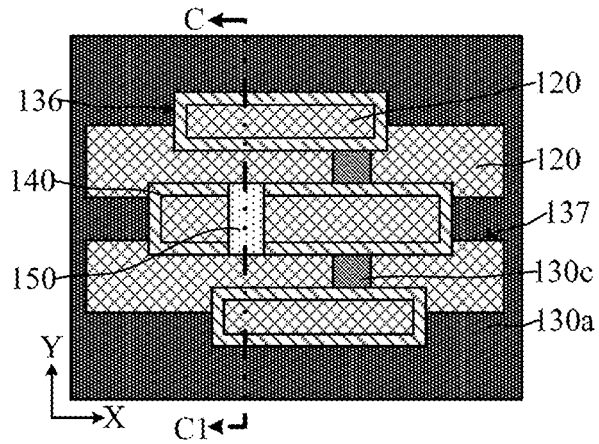

FIG. 22 is a top view based on FIG. 21. The second mask-material-layer part 130b (as shown in FIG. 21) is removed, and a second trench 137 exposing a part of the to-be-etched material layer 120 is formed in the remaining mask material layer 130.

The second trench 137 is used to define a remaining region to be removed in the subsequent to-be-etched material layer 120.

The etching selection ratio of the second mask-material-layer part 130b to the first mask-material-layer part 130a is relatively large, and the etching selection ratio of the third mask-material-layer part 130c to the second mask-material-layer part 130b is also relatively large, so that the process window for forming the second trench 137 is significantly increased, and the pattern precision of the formed second trench 137 is ensured. Moreover, compared with a solution in which the first trench and the second trench are formed in a same step, the first trench 136 is formed in another step, so that the process window for a photolithography process is increased. For example, the resolution limit of the photolithography process is exceeded, so that the pattern precision of both the first trench 136 and the second trench 137 can be improved. Correspondingly, after the to-be-etched material layer 120 exposed from the first trench 136 and the second trench 137 is subsequently removed to form a target pattern layer, the pattern precision in the target pattern layer is correspondingly improved.

In some implementations, the side wall layer 140 is formed on the side wall of the first trench 136. Therefore, the second mask-material-layer part 130b is removed by using the side wall layer 140 as a mask, thereby isolating the second trench 137 from the first trench 136.

In some implementations, the second mask-material-layer part 130b is removed using a wet etching process. In the wet etching process, the second mask-material-layer part 130b is removed through chemical reactions, so as to reduce damage inflicted to the to-be-etched material layer 120 exposed from the first trench 136.

In other implementations, an ashing process may alternatively be chosen to remove the second mask-material-layer part.

Figure 23:
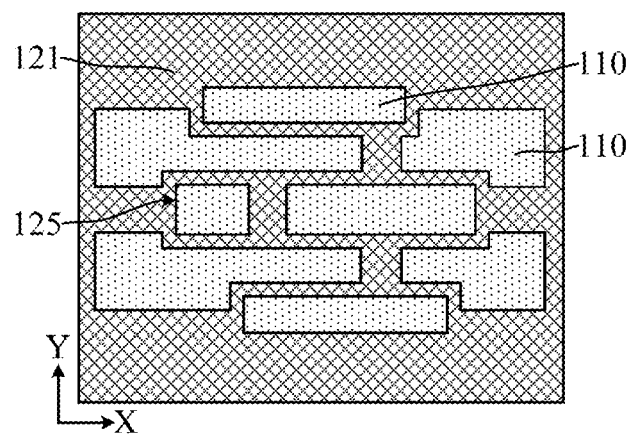

FIG. 23 is a top view based on FIG. 22. The to-be-etched material layer 120 (as shown in FIG. 22) exposed from the first trench 136 (as shown in FIG. 22) and the second trench 137 (as shown in FIG. 22) is removed, and the remaining to-be-etched material layer 120 is used as a target pattern layer 121.

In some implementations, the to-be-etched material layer 120 is an HM material layer. Correspondingly, the target pattern layer 121 is an HM layer. The HM layer is used as a mask for subsequently patterning the dielectric layer 110.

After the to-be-etched material layer 120 exposed from the first trench 136 and the second trench 137 is removed, the patterns of the first trench 136 and the second trench 137 are transferred to the target pattern layer 121, and a plurality of mask openings 125 are formed in the target pattern layer 121. The first trench 136 and the second trench 137 have relatively high pattern precision, so that the pattern precision of the mask openings 125 is correspondingly improved.

In some implementations, the side wall layer 140 is formed on the side wall of the first trench 136, and the passivation layer 150 is formed in at least one first trench 136. Therefore, in the step of forming the target pattern layer 121, the to-be-etched material layer 120 exposed from the first trench 136 and the second trench 137 is removed by using the side wall layer 140 and the passivation layer 150 as masks.

In some implementations, after the target pattern layer 121 is formed, the method further includes: removing the side wall layer 140, the passivation layer 150, and the remaining mask material layer 130.

Specifically, the side wall layer 140, the passivation layer 150, and the remaining mask material layer 130 are removed using a dry etching process. By adjusting parameters of the dry etching process, the side wall layer 140, the passivation layer 150, and the remaining mask material layer 130 can be removed on a same etching machine.

Figure 24:
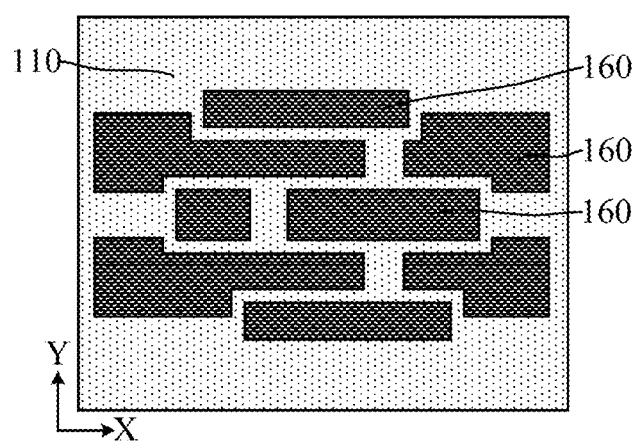

FIG. 24 is a top view based on FIG. 23. The forming method further includes: patterning the dielectric layer 110 by using the target pattern layer 121 (as shown in FIG. 23) as a mask, forming an interconnection opening (not shown) in the dielectric layer 110, and filling a conductive material in the interconnection opening, to form an interconnection structure 160.

The mask openings 125 (as shown in FIG. 23) have relatively high pattern precision, thereby improving the pattern precision of the interconnection opening, so that the topography and layout of the interconnection structure 160 satisfy design requirements, and correspondingly the performance of the interconnection structure 160 is improved.

In some implementations, the interconnection structure 160 is a metal interconnection line in a BEOL process.

The process of forming the interconnection structure 160 usually includes flattening treatment, and the target pattern layer 121 is removed during the flattening treatment.

As the circuit integration level increases, it becomes increasingly complex to design BEOL metal wiring, and the pitch between adjacent metal interconnection lines keeps decreasing. By using the foregoing manner of forming the first trench 136 and the second trench 137, the formation quality and performance of the metal interconnection lines are significantly improved, thereby improving the performance and reliability of the semiconductor structure. For example, the metal interconnection line is a first metal (M1) interconnection line.

In other implementations, the dielectric layer may further be an inter-layer dielectric layer, and the interconnection structure is correspondingly a contact hole plug.

It should be noted that in other implementations, in the foregoing forming method, after the first doping treatment is performed, the second mask-material-layer part is a part that has undergone the first doping treatment in the mask material layer.

In some implementations, during the first doping treatment, impurity ions damage the lattices of the second mask-material-layer part and reduce the material density of the second mask-material-layer part, so that the second mask-material-layer part becomes easily removable, and correspondingly the etching selection ratio of the second mask-material-layer part to the first mask-material-layer part can also be increased.

Accordingly, in some implementations, in the step of forming the mask material layer on the to-be-etched material layer, the material of the mask material layer is silicon oxide or silicon nitride.

When the material of the mask material layer is silicon oxide, the doping ions in the foregoing first doping treatment are Ar ions. When the material of the mask material layer is silicon nitride, the doping ions in the foregoing first doping treatment are H ions or He ions.

It should be noted that in this case, correspondingly, the foregoing second doping treatment does not need to be performed. In the step of the foregoing the first doping treatment, a pattern layer (for example, a photoresist layer) only exposes the mask material layer in a region corresponding to the second mask-material-layer part that is to be removed.

Refer to the corresponding description in the implementations described above, as details may not be described herein again.

Figure 25:
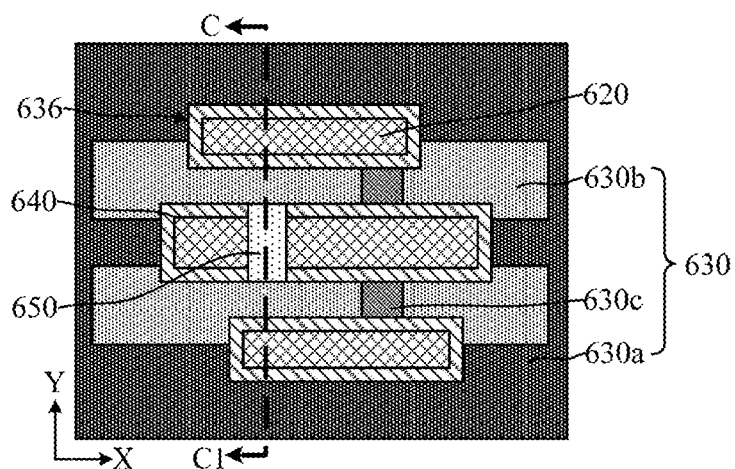
FIG. 25 and FIG. 26 are schematic structural diagrams of one form of a semiconductor structure.
Figure 26:
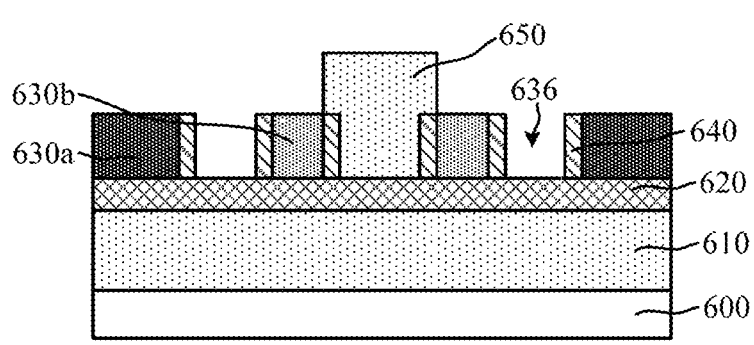

A form of the present disclosure provides a semiconductor structure. FIG. 25 and FIG. 26 are schematic structural diagrams of one form of a semiconductor structure. FIG. 25 is a top view, and FIG. 26 is a sectional view along a section line CC1 in FIG. 25.

The semiconductor structure includes: a base 600; a to-be-etched material layer 620, located on the base 600; a mask material layer 630 (as shown in FIG. 25), located on the to-be-etched material layer 620, where the mask material layer 630 includes a first mask-material-layer part 630a and a to-be-removed second mask-material-layer part 630b, the first mask-material-layer part 630a has doping ions, or, the second mask-material-layer part 630b has doping ions; and a trench 636, located in the mask material layer 630, where the trench 636 is at least located in the first mask-material-layer part 630a.

In some implementations, for example, the semiconductor structure is a planar transistor. The base 600 includes a substrate. Specifically, the substrate is a silicon substrate. In other implementations, the material of the substrate may further be germanium, silicon-germanium, silicon carbide, gallium arsenide, indium gallium phosphide, among other materials. The substrate may further be another type of substrate such as a silicon-on-insulator substrate or a germanium-on-insulator substrate.

In other implementations, when the semiconductor structure is a fin field-effect transistor, the base may correspondingly include a substrate and a fin protruding from the substrate.

The base 600 may further include another structure such as a gate structure, a doped region, an STI structure, and a dielectric layer. In some implementations, the base 600 further includes an inter-layer dielectric layer (not shown) located on the substrate and a contact hole plug (not shown) formed in the inter-layer dielectric layer.

In some implementations, the semiconductor structure further includes: a dielectric layer 610 located on the base 600.

The dielectric layer 610 is used to electrically isolate interconnection structures. In some implementations, the dielectric layer 610 is an IMD layer and is used to electrically isolate metal interconnection structures in a BEOL process.

Specifically, the dielectric layer 610 is a first IMD used to electrically isolate first metal interconnection lines. The first metal interconnection line is a metal interconnection structure closest to a contact hole plug. In other implementations, the dielectric layer may further be an IMD located on the first metal interconnection line and used to electrically isolate other interconnection structures. For example, the dielectric layer is a second IMD used to electrically isolate second metal interconnection lines and electrically isolate via structures located between the second metal interconnection line and the first metal interconnection line.

Accordingly, the material of the dielectric layer 610 is a low k dielectric material, an ultra-low k dielectric material, silicon oxide, silicon nitride, silicon oxynitride or the like. In some implementations, the material of the dielectric layer 610 is an ultra-low k dielectric material. Specifically, the ultra-low k dielectric material may be SiOCH.

In other implementations, the dielectric layer may further be an inter-layer dielectric layer and used to electrically isolate the contact hole plug.

After a patterning process is performed on the to-be-etched material layer 620, a target pattern that penetrates the thickness of the to-be-etched material layer 620 is formed inside the to-be-etched material layer 620. In some implementations, the to-be-etched material layer 620 is located on the dielectric layer 610. The to-be-etched material layer 620 is an HM material layer. That is, the material of the to-be-etched material layer is an HM material. After the to-be-etched material layer 620 is patterned to form a target pattern layer, the target pattern layer is used as a mask for patterning the dielectric layer 610.

Accordingly, the material of the to-be-etched material layer 620 may include one or more of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, and tungsten nitride.

In some implementations, the dielectric layer 610 is an IMD layer. Therefore, the material of the to-be-etched material layer 620 is titanium nitride. In other implementations, the to-be-etched material layer may further be a stacked structure, including a bottom etch stop material layer, an HM material layer located on the bottom etch stop material layer, and a top etch stop material layer located on the HM material layer. The materials of the bottom etch stop material layer and the top etch stop material layer are usually silicon oxide.

The patterned mask material layer 630 is used as a mask for patterning the to-be-etched material layer 620.

Therefore, an etching selection ratio of the mask material layer 630 to the to-be-etched material layer 620 is relatively high, so that selective etching is implemented in a subsequent etching process. In some implementations, the material of the mask material layer 630 is different from the material of the to-be-etched material layer 620.

In some implementations, the material of the mask material layer 630 is amorphous silicon. The amorphous silicon is a common mask material used to pattern an MHM material layer in a BEOL process. In other implementations, the material of the mask material layer 630 is set according to the material of the to-be-etched material layer. The material of the mask material layer may further be silicon oxide or silicon nitride.

In some implementations, a trench is formed in the mask material layer 630. The trench is at least located in the first mask-material-layer part 630a. Specifically, the trench is defined as a first trench 636. The first trench 636 is used to define a partial region to be etched in the to-be-etched material layer 620. In a subsequent process, a second trench exposing a part of the to-be-etched material layer 620 may be formed in the mask material layer 630 by removing the second mask-material-layer part 630b. The second trench is used to define a remaining region to be etched in the to-be-etched material layer 620.

In some implementations, ions are doped in the first mask-material-layer part 630a, so that the grain boundary spacing in the material in the first mask-material-layer part 630a is reduced, thereby improving the thermal stability and chemical stability of the first mask-material-layer part 630a. When the stability is improved, the corrosion resistance capability of the first mask-material-layer part 630a is correspondingly improved, so that an etching selection ratio of the second mask-material-layer part 630b to the first mask-material-layer part 630a is relatively large, and the process window for forming the second trench is significantly increased (for example, the second mask-material-layer part may be removed by using maskless etching 630b), so that the pattern precision of the formed second trench is ensured.

Moreover, the first trench 636 and the second trench are formed in different steps. Compared with a solution in which the first trench and the second trench are formed in a same step, in some implementations, the process window for a photolithography process is improved. For example, the resolution limit of the photolithography process is exceeded, so that the pattern precision of both the first trench 636 and the second trench can be improved. Correspondingly, after the to-be-etched material layer 620 exposed from the first trench 636 and the second trench is subsequently removed to form a target pattern layer, the pattern precision in the target pattern layer is correspondingly improved.

In some implementations, the material of the mask material layer 630 is amorphous silicon. Therefore, the doping ions in the first mask-material-layer part 630a are B ions. Correspondingly, the material of the first mask-material-layer part 630a turns into boron-doped silicon, so that the etching selection ratio of the second mask-material-layer part 630b to the first mask-material-layer part 630a is significantly increased. Moreover, B atoms are relatively stable, so that the thermal stability and chemical stability of the first mask-material-layer part 630a are improved. In addition, B ions are common doping ions in the semiconductor field and have relatively high process compatibility.

In some implementations, the concentration of the doping ions in the first mask-material-layer part 630a is appropriately set, so that the etching selection ratio of the second mask-material-layer part 630b to the first mask-material-layer part 630a satisfies process requirements, and impurity ions in the first mask-material-layer part 630a are prevented from diffusing into the first mask-material-layer part 630a, thereby ensuring topographic quality of the subsequent second trench.

It should be noted that in some implementations, an extension direction (the direction X shown in FIG. 25) of the first trench 636 is the same as an extension direction of the second mask-material-layer part 630b, and in a direction (the direction Y shown in FIG. 25) perpendicular to the extension direction of the second mask-material-layer part 630*b*, the first trench 636 is located at a boundary between the first mask-material-layer part 630*a* and the second mask-material-layer part 630*b*.

The first trench 636 is located at the boundary between the first mask-material-layer part 630*a* and the second mask-material-layer part 630*b*, so that the pitch between the subsequent adjacent first trench 636 and second trench is reduced, and a complexity requirement of an IC design is satisfied. In other implementations, according to requirements of an IC design, the first trench may alternatively be located in the first mask-material-layer part on a side of the second mask-material-layer part.

Accordingly, in some implementations, the semiconductor structure further includes: a side wall layer 640, located on a side wall of the first trench 636.

The second trench is formed by removing the second mask-material-layer part 630*b*, and the side wall layer 640 is used to isolate the second trench from the first trench 636, thereby preventing communication between the second trench and the first trench 636. Moreover, the pitch between the adjacent second trench and first trench 636 has the designed minimum space.

Accordingly, an etching selection ratio of the side wall layer 640 to the second mask-material-layer part 630*b* is relatively high, so that the side wall layer 640 can be used as a mask for the subsequent removal of the second mask-material-layer part 630*b*. In some implementations, the material of the side wall layer 640 is different from the material of the second mask-material-layer part 630*b*. The material of the side wall layer 640 is titanium oxide. Etching selection ratios of titanium oxide to amorphous silicon and titanium nitride are relatively high. In other implementations, the material of the side wall layer 640 is set according to the materials of the to-be-etched material layer and the mask material layer. The material of the side wall layer may further be titanium nitride, silicon oxide, silicon nitride, silicon oxynitride or silicon carbide.

In other implementations, when the first trench is located in the first mask-material-layer part on a side of the second mask-material-layer part, the side wall layer may also be omitted in the semiconductor structure.

In some implementations, the mask material layer 630 further includes: a third mask-material-layer part 630*c*. In a direction perpendicular to the extension direction of the second mask-material-layer part 630*b*, the third mask-material-layer part 630*c* penetrates the second mask-material-layer part 630*b*, and the third mask-material-layer part 630*c* has doping ions.

The third mask-material-layer part 630*c* is used as a cut feature for the subsequent second trench. The third mask-material-layer part 630*c* is used to divide the second mask-material-layer part 630*b*, so that after the second mask-material-layer part 630*b* is removed, a plurality of isolated second trenches may be formed in the mask material layer 630.

An etching selection ratio of the third mask-material-layer part 630*c* to the second mask-material-layer part 630*b* is relatively large. Therefore, during the removal of the second mask-material-layer part 630*b*, the third mask-material-layer part 630*c* can be kept, so that a plurality of isolated second trenches are formed, the process window for forming the second trench is correspondingly improved, and the pattern precision of the formed second trench is ensured.

In some implementations, doping ions in the third mask-material-layer part 630*c* are the same as the doping ions in the first mask-material-layer part 630*a*, so that in the subsequent step of removing the third mask-material-layer part 630*c* and the first mask-material-layer part 630*a*, a difference between removal rates of the first mask-material-layer part 630*a* and the third mask-material-layer part 630*c* is reduced, and it is easy to remove the first mask-material-layer part 630*a* and the third mask-material-layer part 630*c* in a same step.

In some implementations, the concentration of the doping ions in the third mask-material-layer part 630*c* is appropriately set, so that the etching selection ratio of the third mask-material-layer part 630*c* to the second mask-material-layer part 630*b* and an etching selection ratio of the third mask-material-layer part 630*c* to the first mask-material-layer part 630*a* satisfy process requirements, and impurity ions in the first mask-material-layer part 630*a* are prevented from diffusing into another region.

In some implementations, it may be known according to the foregoing analysis that the doping ions in the third mask-material-layer part 630*c* are B ions.

According to the type of the doping ions in the third mask-material-layer part 630*c* and the subsequent first mask-material-layer part 630*a*, the concentration of the doping ions in the third mask-material-layer part 630*c* and the subsequent first mask-material-layer part 630*a* is appropriately set, so that the etching selection ratio of the third mask-material-layer part 630*c* to the first mask-material-layer part 630*a* may be approximately 1 (for example, 0.8 to 1.2) to facilitate the removal of the first mask-material-layer part 630*a* and the third mask-material-layer part 630*c* in a same step, so as to simplify process steps.

It should be noted that the semiconductor structure further includes: a passivation layer 650, at least located in one first trench 636, where in the extension direction of the first trench 636, the corresponding remaining to-be-etched material layer 620 at the bottom of the first trench 636 is exposed from two sides of the passivation layer 650.

The passivation layer 650 is used as a cut feature for the first trench. In the extension direction of the first trench 636, the passivation layer 650 covers a partial region of the to-be-etched material layer 620, so that the to-be-etched material layer 620 below the passivation layer 650 is kept in a subsequent etching process. Correspondingly, when the pattern of the first trench 636 is transferred to the to-be-etched material layer 620, isolated patterns can be formed on the to-be-etched material layer 620. Compared with a solution in which a photolithography process is used to divide the first trench 636 in the extension direction of the first trench 636, in some implementations, the process window for forming the first trench 636 is increased, and the precision of pattern transfer is improved.

In some implementations, the material of the passivation layer 650 is LTO. The material has relatively high filling performance, so that the filling quality of the passivation layer 650 in the first trench 636 is improved. Moreover, the material is an easily removable material, so that the subsequent process of removing the passivation layer 650 becomes less difficult. In other implementations, the material of the passivation layer may further be SiOC.

In some implementations, in a direction perpendicular to the extension direction of the first trench 636, the passivation layer 650 further covers the corresponding side wall layer 640 on the side wall of the first trench 636. The process of forming the passivation layer 650 includes a photolithography process. The length of the passivation layer 650 is increased, so that the process window in the photolithography process is correspondingly increased. For example, the resolution limit of the photolithography process is exceeded. The length of the passivation layer 650 is the size of the passivation layer 650 in a direction perpendicular to the extension direction of the first trench 636.

In other implementations, the passivation layer may alternatively cover only the to-be-etched material layer between side wall layers.

It should be noted that some implementations are described using an example in which the first mask-material-layer part 630*a* has doping ions. In other implementations, alternatively, the second mask-material-layer part has doping ions, and the first mask-material-layer part correspondingly does not have doping ions.

In the semiconductor field, ion doping is usually used, so that the second mask-material-layer part has doping ions. During ion doping, the doping ions damage the lattices of the second mask-material-layer part and reduce the material density of the second mask-material-layer part, so that the second mask-material-layer part becomes easily removable, and correspondingly the etching selection ratio of the second mask-material-layer part to the first mask-material-layer part can also be increased.

Accordingly, in some implementations, the material of the mask material layer is correspondingly silicon oxide or silicon nitride.

When the material of the mask material layer is silicon oxide, the second mask-material-layer part has doping ions, and the doping ions are Ar ions. Alternatively, when the material of the mask material layer is silicon nitride, the second mask-material-layer part has doping ions, and the doping ions are H ions or He ions.

It should be noted that in this case, the semiconductor structure correspondingly does not include a third mask-material-layer part. The remaining part other than the second mask-material-layer part in the mask material layer is used as the first mask-material-layer part.

Refer to the corresponding description in the implementations described above, as details may not be described herein again.

The semiconductor structure in some currently-described implementations may be formed using the forming method in the implementations described above or may be formed using another forming method. Refer to the corresponding description in the implementations described above, as details may not be described herein again.

The present disclosure is described above, but the present disclosure is not limited thereto. A person skilled in the art may make various variations and changes without departing from the spirit and scope of the present disclosure. Therefore, the protection scope of the present disclosure should be as defined by the claims.

What is claimed is:

1. A method for forming a semiconductor structure, comprising:
   providing a base;
   forming a to-be-etched material layer on the base;
   forming a mask material layer on the to-be-etched material layer;
   performing a first doping treatment on a partial region of the mask material layer, wherein:
      the first doping treatment is suitable for increasing an etching selection ratio of the mask material layer that has not undergone the first doping treatment to the mask material layer that has undergone the first doping treatment,
      after the first doping treatment is performed, the mask material layer comprises a first mask-material-layer part and a to-be-removed second mask-material-layer part, and
      the first mask-material-layer part is a part that has undergone the first doping treatment in the mask material layer, or, the second mask-material-layer part is a part that has undergone the first doping treatment in the mask material layer;
   after the first doping treatment is performed, forming, in the mask material layer, a first trench exposing a part of the to-be-etched material layer, wherein the first trench is at least located in the first mask-material-layer part;
   after the first trench is formed, removing the second mask-material-layer part, and forming a second trench exposing a part of the to-be-etched material layer in the remaining mask material layer;
   removing the to-be-etched material layer exposed from the first trench and the second trench, and forming a target pattern layer; and
   after the target pattern layer is formed, removing the remaining mask material layer.

2. The method for forming a semiconductor structure according to claim 1, wherein in the step of forming a first trench, an extension direction of the first trench is the same as an extension direction of the second mask-material-layer part, and in a direction perpendicular to the extension direction of the second mask-material-layer part, the first trench is located at a boundary between the first mask-material-layer part and the second mask-material-layer part;
   before the second mask-material-layer part is removed, the method further comprises: forming a side wall layer on a side wall of the first trench; and
   in the step of forming a second trench, removing the second mask-material-layer part by using the side wall layer as a mask; and
   in the step of forming a target pattern layer, removing the to-be-etched material layer exposed from the first trench and the second trench by using the side wall layer as a mask.

3. The method for forming a semiconductor structure according to claim 2, wherein the material of the side wall layer is titanium oxide, titanium nitride, silicon oxide, silicon nitride, silicon oxynitride or silicon carbide.

4. The method for forming a semiconductor structure according to claim 2, wherein the process of forming the side wall layer comprises an atomic layer deposition process.

5. The method for forming a semiconductor structure according to claim 1, wherein:
   after the first doping treatment is performed, the first mask-material-layer part is a part that has undergone the first doping treatment in the mask material layer; and
   in the step of forming a mask material layer on the to-be-etched material layer, the material of the mask material layer is amorphous silicon; or
   after the first doping treatment is performed, the second mask-material-layer part is a part that has undergone the first doping treatment in the mask material layer; and
   in the step of forming a mask material layer on the to-be-etched material layer, the material of the mask material layer is silicon oxide or silicon nitride.

6. The method for forming a semiconductor structure according to claim 1, wherein the material of the mask material layer is amorphous silicon, and doping ions in the first doping treatment are B ions; or the material of the mask material layer is silicon oxide, and doping ions in the first doping treatment are Ar ions; or the material of the mask material layer is silicon nitride, and doping ions in the first doping treatment are H ions or He ions.

7. The method for forming a semiconductor structure according to claim 1, wherein:

the first doping treatment is performed using an ion implantation process, and parameters of the first doping treatment comprise: implantation energy of 1 Key to 10 Key, implantation dosage of 1E14 atoms per square centimeter to 1E16 atoms per square centimeter, and an implantation direction at an angle of 0 degrees to 45 degrees from the normal of the surface of the base.

8. The method for forming a semiconductor structure according to claim 1, wherein the second mask-material-layer part is removed using a wet etching process or an ashing process.

9. The method for forming a semiconductor structure according to claim 1, wherein:

after the first doping treatment is performed, the first mask-material-layer part is a part that has undergone the first doping treatment in the mask material layer;

before the first trench is formed, the forming method further comprises: performing a second doping treatment on a partial region of the mask material layer, wherein the second doping treatment is suitable for increasing an etching selection ratio of the mask material layer that has not undergone the second doping treatment to the mask material layer that has undergone the second doping treatment, and the mask material layer that has undergone the second doping treatment is used as a third mask-material-layer part; and after the first doping treatment and the second doping treatment are performed, the first mask-material-layer part is connected to the third mask-material-layer part, and the mask material layer corresponding to a region defined by the first mask-material-layer part and the third mask-material-layer part is the second mask-material-layer part.

10. The method for forming a semiconductor structure according to claim 9, wherein the second doping treatment is performed before the first doping treatment is performed; or, the first doping treatment is performed before the second doping treatment is performed.

11. The method for forming a semiconductor structure according to claim 9, wherein doping ions in the second doping treatment are the same as doping ions in the first doping treatment.

12. The method for forming a semiconductor structure according to claim 9, wherein doping ions in the second doping treatment are B ions.

13. The method for forming a semiconductor structure according to claim 9, wherein the second doping treatment is performed using an ion implantation process, where parameters of the second doping treatment comprise: implantation energy of 1 Key to 10 Key, implantation dosage of 1E14 atoms per square centimeter to 1E16 atoms per square centimeter, and an implantation direction at an angle of 0 degrees to 45 degrees from the normal of the surface of the base.

14. The method for forming a semiconductor structure according to claim 9, wherein:

the second doping treatment is performed before the first doping treatment is performed; and the step of performing a first doping treatment on a partial region of the mask material layer comprises: forming a pattern layer on the mask material layer, wherein the pattern layer traverses the third mask-material-layer part, wherein in an extension direction of the third mask-material-layer part, and the pattern layer exposes the border of the third mask-material-layer part, or, a side wall of the pattern layer near a side of the border of the third mask-material-layer part is level with the border of the third mask-material-layer part; performing the first doping treatment on the mask material layer exposed from the pattern layer; and removing the pattern layer.

15. The method for forming a semiconductor structure according to claim 1, wherein after the first doping treatment is performed, the first mask-material-layer part is a part that has undergone the first doping treatment in the mask material layer; and the step of performing a first doping treatment on a partial region of the mask material layer comprises: forming a pattern layer on the mask material layer using a photolithography process or a self-aligned double patterning (SADP) process; performing the first doping treatment on the mask material layer exposed from the pattern layer; and removing the pattern layer.

16. The method for forming a semiconductor structure according to claim 1, wherein the mask material layer is etched using a dry etching process, and the first trench is formed in the mask material layer.

17. The method for forming a semiconductor structure according to claim 1, wherein:

the method further comprises: after the first trench is formed, and before the second trench is formed, forming at least a passivation layer in one first trench, wherein in an extension direction of the first trench, the corresponding remaining to-be-etched material layer at the bottom of the first trench is exposed from two sides of the passivation layer; and in the step of forming a target pattern layer, the to-be-etched material layer exposed from the first trench and the second trench is removed using the passivation layer as a mask.

18. The method for forming a semiconductor structure according to claim 17, wherein:

the step of forming a passivation layer comprises: forming a sacrifice layer on the to-be-etched material layer exposed from the remaining mask material layer, wherein the sacrifice layer covers the top of the remaining mask material layer;

forming a through groove in the sacrifice layer above a partial region of the first trench, wherein in a direction perpendicular to the extension direction of the first trench, the through groove at least exposes the corresponding to-be-etched material layer at the bottom of the first trench;

forming the passivation layer that fills the through groove; and after the passivation layer is formed, removing the sacrifice layer.

19. The method for forming a semiconductor structure according to claim 17, wherein the material of the passivation layer is LTO or SiOC.

20. The method for forming a semiconductor structure according to claim 1, wherein:

in the step of forming a to-be-etched material layer on the base, the to-be-etched material layer comprises a hard mask (HM) material layer;

the method further comprises:
before the to-be-etched material layer is formed on the base, forming a dielectric layer on the base; and
after the remaining mask material layer is removed, patterning the dielectric layer by using the target pattern layer as a mask, and forming an interconnection opening in the dielectric layer; and filling a conductive material in the interconnection opening, to form an interconnection structure.

21. The method for forming a semiconductor structure according to claim 20, wherein the interconnection structure is a metal interconnection line or a contact hole plug.

* * * * *